(12) United States Patent
Yamazaki

(10) Patent No.: US 10,332,720 B2
(45) Date of Patent: Jun. 25, 2019

(54) CHARGED PARTICLE SYSTEM AND METHOD FOR MEASURING DEFLECTION FIELDS IN A SAMPLE

(71) Applicant: JEOL Ltd., Tokyo (JP)

(72) Inventor: Kazuya Yamazaki, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 15/258,025

(22) Filed: Sep. 7, 2016

(65) Prior Publication Data

US 2017/0133196 A1    May 11, 2017

(30) Foreign Application Priority Data

Sep. 7, 2015   (JP) ................. 2015-175939

(51) Int. Cl.
| | |
|---|---|
| *H01J 37/10* | (2006.01) |
| *H01J 37/22* | (2006.01) |
| *H01J 37/147* | (2006.01) |
| *H01J 37/26* | (2006.01) |
| *H01J 37/28* | (2006.01) |

(52) U.S. Cl.
CPC ............ *H01J 37/226* (2013.01); *H01J 37/10* (2013.01); *H01J 37/147* (2013.01); *H01J 37/268* (2013.01); *H01J 37/28* (2013.01); *H01J 2237/221* (2013.01); *H01J 2237/2614* (2013.01); *H01J 2237/2802* (2013.01); *H01J 2237/2803* (2013.01)

(58) Field of Classification Search
None
See application file for complete search history.

(56) References Cited

U.S. PATENT DOCUMENTS

| | | | | | |
|---|---|---|---|---|---|
| 4,626,689 | A | * | 12/1986 | Tomita | H01J 37/04 250/396 R |
| 5,004,918 | A | * | 4/1991 | Tsuno | H01J 37/222 250/307 |
| 2011/0049363 | A1 | * | 3/2011 | Koch | G01N 23/20058 250/307 |
| 2013/0234024 | A1 | * | 9/2013 | Kubo | H01J 37/222 250/307 |
| 2018/0337019 | A1 | * | 11/2018 | Sagawa | G01N 23/20058 |

FOREIGN PATENT DOCUMENTS

JP             193041 A     4/1989

* cited by examiner

*Primary Examiner* — James Choi
(74) *Attorney, Agent, or Firm* — The Webb Law Firm

(57) ABSTRACT

There is provided a charged particle system (100) that has: illumination optics (104) for illuminating a sample with charged particles; an imaging deflector system (112) disposed behind an objective lens (110); a detector (116) having a detection surface (115), imaging optics (114) disposed behind the imaging deflector system (112) and operative to focus the charged particles as diffraction discs (2) onto the detection surface (115); a storage unit (120) for storing intensity information detected by the detector (116); and a controller (130) for controlling the imaging deflector system (112). The controller (130) controls the imaging deflector system (112) to cause the charged particles passing through a given position of particle impingement on the sample to be deflected under successively different sets of deflection conditions and to bring the diffraction discs (2) into focus onto successively different regions of the detection surface (115).

9 Claims, 9 Drawing Sheets

CHARGED PARTICLE SYSTEM AND METHOD FOR MEASURING DEFLECTION FIELDS IN A SAMPLE

BACKGROUND OF THE INVENTION

Field of the Invention

The present invention relates to a charged particle system and also to a measuring method.

Description of Related Art

It is known in the field of scanning transmission electron microscopy (STEM) that the differential phase contrast (DPC) method is available as a technique to visualize electromagnetic fields. The differential phase contrast method is a technique of measuring the amount of a deflection, which occurs when an electron beam is transmitted through a sample, and of computing such electromagnetic fields (deflection fields) in the sample which cause the deflection of the beam (see, for example, JP-A-1-93041).

Although the DPC method is a quite excellent technique as a method of imaging the deflection fields in the sample, a dedicated segmented detector is required as set forth in JP-A-1-93041.

SUMMARY OF THE INVENTION

In view of the foregoing problem, the present invention has been made. One object associated with some aspects of the present invention is to provide a charged particle system capable of measuring deflection fields in a sample without using a segmented detector. Another object associated with some aspects of the invention is to provide a method whereby deflection fields in a sample can be measured without using a segmented detector.

(1) A charged particle system associated with the present invention has: a charged particle source for producing charged particles; illumination optics for illuminating a sample with the charged particles; an objective lens for focusing the charged particles transmitted through the sample; an imaging deflector system disposed behind the objective lens and operative to deflect the charged particles; a detector having a detection surface and operative to detect the charged particles incident thereon and to output intensity information corresponding to the number of the detected charged particles; imaging optics disposed behind the imaging deflector system and operative to focus the charged particles as diffraction discs onto the detection surface; a storage unit for storing the intensity information output from the detector; and a controller for controlling the imaging deflector system.

The controller controls the imaging deflector system to cause the charged particles passing through a given position of particle impingement on the sample to be deflected under successively different sets of deflection conditions and to bring the diffraction discs into focus onto successively different regions of the detection surface. The storage unit stores the intensity information for each set of the deflection conditions.

In this charged particle system, the strength and direction of each deflection field in the sample can be found from the intensity information that is obtained for each set of the deflection conditions. Thus, in this charged particle system, the deflection fields in the sample can be measured without using a segmented detector.

(2) In one feature of this charged particle system, there may be further provided an illumination deflector system for scanning the charged particles over the sample. The controller controls the imaging deflector system to deflect the charged particles under successively different ones of the sets of deflection conditions at each scan position and to bring the diffraction discs into focus onto successively different regions of the detection surface. The intensity information and information about the scan positions may be stored in an interrelated manner in the storage unit for each set of the deflection conditions.

In this charged particle system, the deflection fields in the sample can be imaged.

(3) In one feature of the charged particle system of (2) above, there may be further provided an image generator for reading the intensity information and the information about the scan positions, which have been stored for each set of the deflection conditions, from the storage unit and generates a scanned image for each set of the deflection conditions.

In this charged particle system, the deflection fields in the sample can be imaged.

(4) A method associated with the present invention is for use in a charged particle system to measure deflection fields in a sample. The charged particle beam system has: a charged particle source for producing charged particles; illumination optics for illuminating the sample with the charged particles; an objective lens for focusing the charged particles transmitted through the sample; an imaging deflector system disposed behind the objective lens and operative to deflect the charged particles; a detector having a detection surface and operative to detect the charged particles incident thereon and to output intensity information corresponding to the number of the detected charged particles; and imaging optics disposed behind the imaging deflector system and operative to focus the charged particles as diffraction discs onto the detection surface.

The method starts with controlling the imaging deflector system to cause the charged particles passing through a given position of particle impingement on the sample to be deflected under successively different sets of deflection conditions and to bring the diffraction discs into focus onto successively different regions of the detection surface. Then, the intensity information is obtained for each set of the deflection conditions.

In this measuring method, the strength and direction of each deflection field in the sample can be found from the intensity information for each set of the deflection conditions. Therefore, with this measuring method, the deflection fields in the sample can be measured without using a segmented detector.

(5) In one feature of this measuring method, the deflection conditions may be so set that, when the charged particles having passed through a reference position of particle impingement on the sample are deflected by the imaging deflector system, the diffraction discs are focused across a boundary of the detection surface.

In this measuring method, the intensity information can be made to correspond to positions of the diffraction discs. Since the positions of the diffraction discs are affected by the deflection fields in the sample, with this measuring method, the strength and direction of each deflection field in the sample can be found from the intensity information.

(6) In one feature of the measuring method of (4) or (5), the deflection conditions may be so set that, when the charged particles passing through a reference position of particle impingement on the sample are deflected by the imaging deflector system, the diffraction discs are focused at positions which are symmetrical with respect to a center of the detection surface.

In this measuring method, the deflection fields in the sample can be calculated with greater ease, for example, than where the diffraction discs are not in positions which are symmetrical with respect to the center of the detection surface.

DESCRIPTION OF THE INVENTION

The preferred embodiment of the present invention is hereinafter described in detail with reference to the drawings. It is to be understood that the embodiment described below is not intended to unduly restrict the content of the present invention delineated by the claims and that not all the configurations described below are essential constituent components of the invention.

1. Charged Particle System

Figure 1:
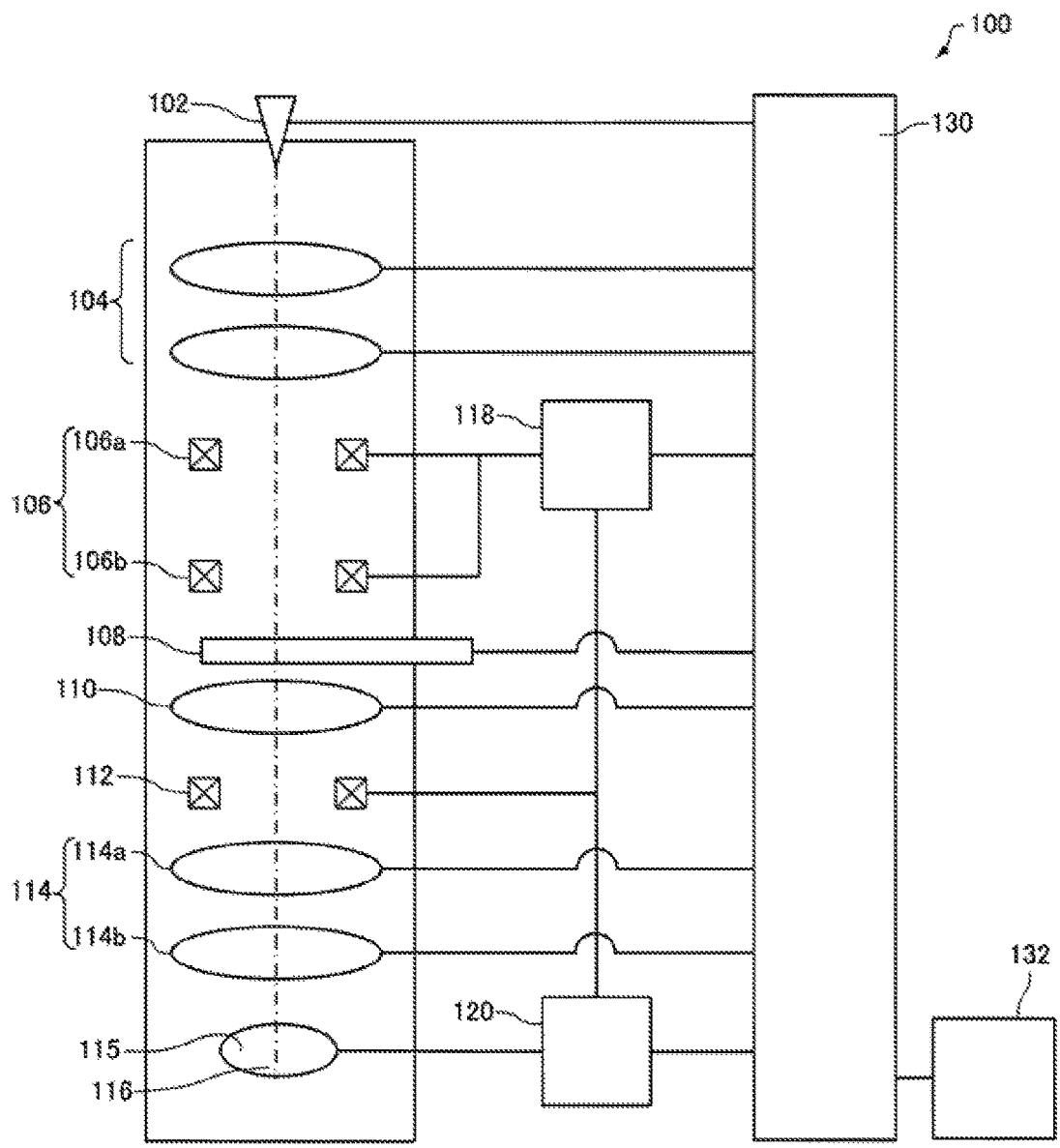
FIG. 1 is a schematic diagram of a charged particle system associated with one embodiment of the present invention, illustrating its configuration.

A charged particle system associated with one embodiment of the present invention is first described by referring to FIG. 1, which schematically shows the configuration of the charged particle system, 100. It is now assumed that the charged particle system 100 is a scanning transmission electron microscope (STEM).

As shown in FIG. 1, the charged particle system 100 includes an electron source 102 being one example of charged particle source, illumination optics 104, an illumination deflector system 106, a sample stage 108, an objective lens 110, an imaging deflector system 112, imaging optics 114, a detector 116 having a detection surface 115, a scan signal generator 118, a frame memory 120 being one example of storage unit, a controller 130, and an image generator 132.

The electron source 102 produces electrons which are one type of charged particles. For instance, the electron source 102 is an electron gun which emits an electron beam by accelerating electrons, emitted from a cathode, by means of an anode.

The illumination optics 104 focus the electrons generated by the electron source 102 onto a sample. Specifically, the illumination optics 104 sharply focus the electrons into an electron probe on the sample.

The illumination deflector system 106 deflects the electron probe focused by the illumination optics 104 to scan the focused electron probe over the sample, based on a scan signal generated by the scan signal generator 118.

The illumination deflector system 106 has a first deflector 106a and a second deflector 106b disposed behind (i.e., on the downstream side as viewed along the flow of electrons) the first deflector 106a. In the illumination deflector system 106, the electrons are deflected by the first deflector 106a and then deflected back by the second deflector 106b. Thus, the electron probe is scanned. That is, the illumination deflector system 106 is a two-stage deflector system. The illumination deflector system 106 may also be a multi-stage deflection system composed of three or more deflectors.

The sample stage 108 holds the sample. The sample stage 108 may hold the sample via a sample holder. The sample stage 108 can move and stop the sample or sample holder and can place the sample in position.

The objective lens 110 initially focuses electrons transmitted through the sample. The objective lens 110 is an initial stage of lens for focusing the electrons transmitted through the sample, i.e., for forming a transmission image. An electron diffraction pattern that is a reciprocal space image is formed in the back focal plane of the objective lens 110. A transmission image (real space image) is formed in the image plane of the objective lens 110.

The objective lens 110 may produce a magnetic field in front of the sample and another magnetic field behind the sample. In this case, the front magnetic field produced by the objective lens 110 acts as a final stage of lens in forming the electron probe.

Figure 2:
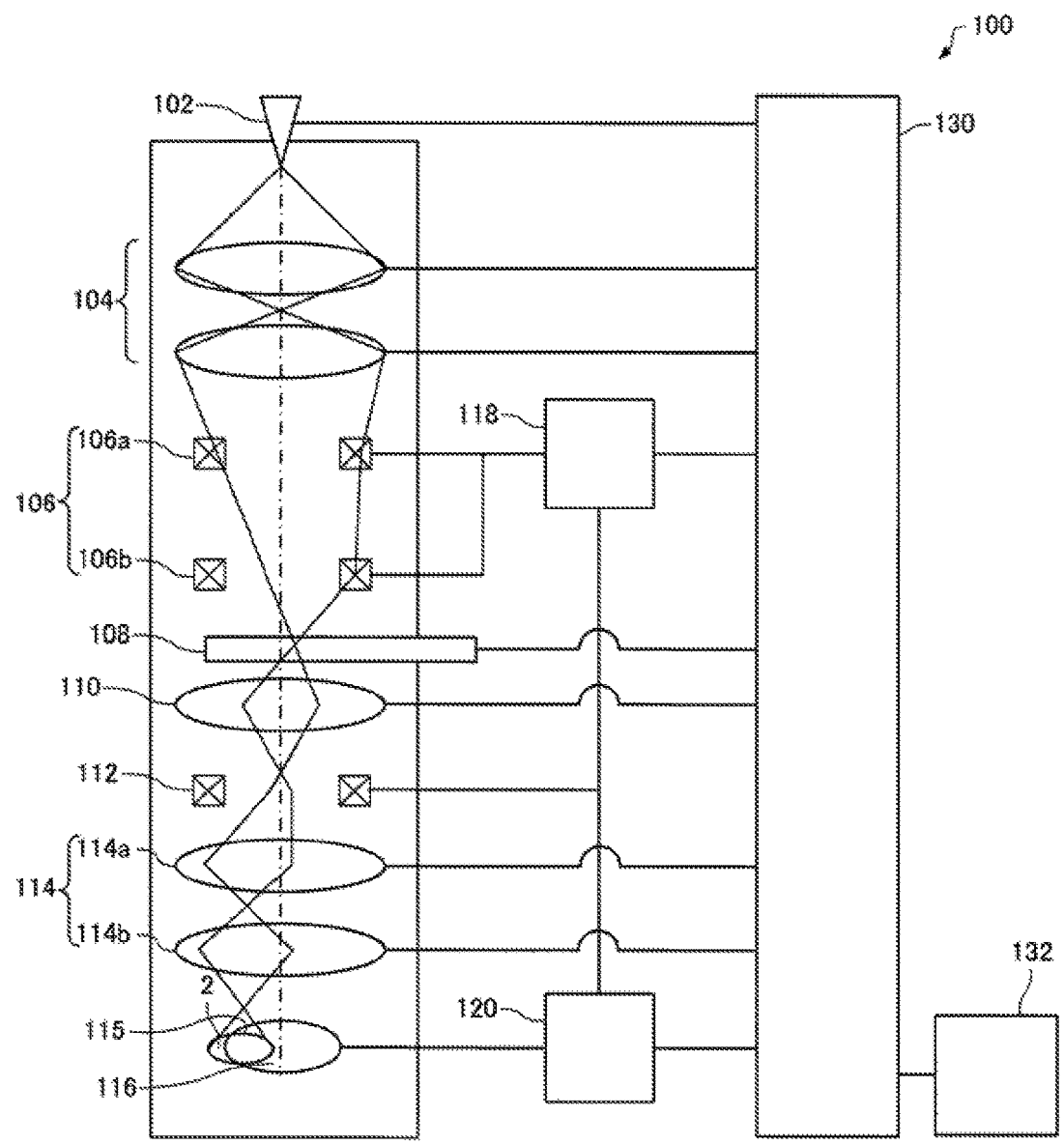
FIG. 2 is a diagram similar to FIG. 1, but illustrating a method of measuring deflection fields by the charged particle system of FIG. 1.

The imaging deflector system 112 is disposed behind the objective lens 110 and between the objective lens 110 and the imaging optics 114. The imaging deflector system 112 deflects the electrons transmitted through the sample. As a result, diffraction discs can be focused at a desired position in the detection surface 115 as shown in FIG. 2. The imaging deflector system 112 is configured including a deflector for deflecting the electrons.

The imaging optics 114 are disposed behind the imaging deflector system 112, and are operative to bring the diffraction pattern, which has been focused by the objective lens 110, into focus on the detection surface 115. The imaging optics 114 are configured including an intermediate lens 114a and a projector lens 114b. The camera length, i.e., the magnification factor of the diffraction pattern, can be varied by changing the operative conditions of the imaging optics 114 (the operative conditions of the intermediate lens 114a).

The detector 116 that is an STEM detector detects electrons striking the detection surface 115 and outputs intensity information corresponding to the number of the detected electrons. The detector 116 counts the electrons striking the detection surface 115 and outputs the intensity information (hereinafter may also be referred to as the electron intensity information) corresponding to the number of counted electrons. The intensity information output from the detector 116 corresponds to the number of electrons counted by the detector 116, for example, per unit time.

The detector 116 counts the electrons incident on the detection surface 115 in a batch. In particular, the detection surface 115 of the detector 116 is not segmented and thus the detector 116 is not a segmented detector. In the illustrated example, the detection surface 115 of the detector 116 is circular in shape but no restriction is placed on the shape.

The scan signal generator 118 produces a scan signal which is used to scan the electron probe over the sample. The scan signal generated by the scan signal generator 118 is sent to the illumination deflector system 106, imaging deflector system 112, and frame memory 120.

The frame memory 120 stores the intensity information output from the detector 116 and information about the position of the electron probe (position of electron impingement) on the sample while associating these two kinds of information with each other in response to the scan signal by storing the output signal from the detector 116 into storage locations of the storage unit addressed in response to the scan signal.

The controller 130 controls the electron source 102, illumination optics 104, illumination deflector system 106, sample stage 108, objective lens 110, imaging deflector system 112, and imaging optics 114. The control operations performed by the controller 130 will be described in detail later.

The controller 130 may be made of dedicated circuitry to perform the various control operations. Furthermore, the controller 130 may comprise a central processing unit (CPU) which executes control programs stored in a storage unit (not shown), whereby the controller 130 acts as a computer and performs the various control operations.

The charged particle system 100 may have a manual control unit (not shown) which performs processing to acquire a control signal responsive to a user's manipulation and to send the signal to the controller 130. The functions of the manual control unit can be realized by buttons, keys, a touch panel display, a microphone, or the like.

The image generator 132 reads the intensity information and the information about the scan positions from the frame memory 120 and images the information. The image generator 132 may be realized by a personal computer or the like. The images generated by the image generator 132 are displayed on a display unit (not shown). The function of the display unit can be realized by an LCD, a CRT, or the like.

2. Operation of the Charged Particle System

The operation of the charged particle system 100 is next described.

(1) Acquisition of STEM Images

The charged particle system 100 can acquire scanning transmission electron microscope (STEM) images by scanning transmission electron microscopy.

In particular, in the charged particle system 100, electrons emitted from the electron source 102 are sharply focused into an electron probe and scanned in two dimensions over the sample by the illumination deflector system 106. The electrons transmitted through the sample are focused onto the detector 116 by the imaging optics 114. The intensity information output from the detector 116 is stored in the frame memory 120 in synchronism with the scan signal, and is imaged by the image generator 132. Thus, an STEM image is created.

(2) Measurement of Deflection Fields in Sample

In the charged particle system 100, the deflection fields (electromagnetic fields) in the sample can be measured by the differential phase contrast (DPC) method. The method of measuring the deflection fields in the sample using the charged particle system 100 is described in detail below.

Prerequisites and setups for the measurement of deflection fields using the charged particle system 100 are first described. FIG. 2 illustrates the method of measuring the deflection fields using the charged particle system 100.

As shown in FIG. 2, in the charged particle system 100, the electrons emitted from the electron source 102 are focused into an electron probe by the illumination optics 104 and made to hit the sample at a given position of electron impingement. Then, the electrons passing through the given position of impingement on the sample are focused onto the detection surface 115 by the use of the imaging optics 114.

Figure 3:
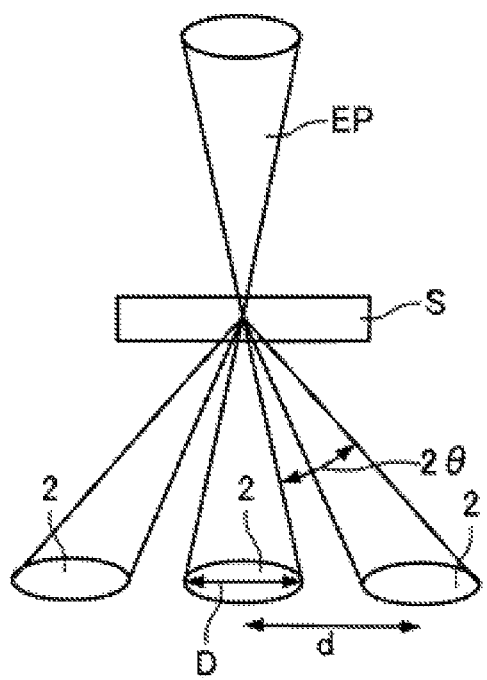
FIG. 3 is a schematic representation illustrating electrons transmitted through a sample.

FIG. 3 illustrates the electrons transmitted through a sample S. As shown in FIG. 3, an electron probe EP is focused into a conical form by the illumination optics 104. Therefore, the electrons transmitted through the sample S are focused as diffraction discs 2 spreading like discs by the objective lens 110 and the imaging optics 114. That is, each diffraction disc 2 has a certain spread in the detection surface 115. The diameter D of the diffraction disc 2 corresponds to the angle of convergence of the electron probe EP formed by the illumination optics 104, and has an angular dimension. Consequently, by previously making measurements using a sample of known crystallinity, the angle of convergence of the electron probe EP, i.e., the diameter D of the diffraction disc 2, can be known. The angle of convergence is given by the following equation:

$$\text{angle of convergence} = 2\theta \times D/d$$

where d is the distance between transmitted and diffracted waves and $2\theta$ is the angle of scattering of electrons scattered in the sample.

The imaging optics 114 are so set up that if the electron probe is scanned over the sample, the diffraction discs 2 do not move in the detection surface 115. In the imaging optics 114, the relative size (diameter D) of each diffraction disc 2 in the detection surface 115 can be determined. The size of the diffraction disc 2 has an angular dimension. Therefore, by measuring the relative size of the diffraction disc 2 in the detection surface 115, the size of the detection surface 115 can be converted into an angular dimension.

Figure 4:
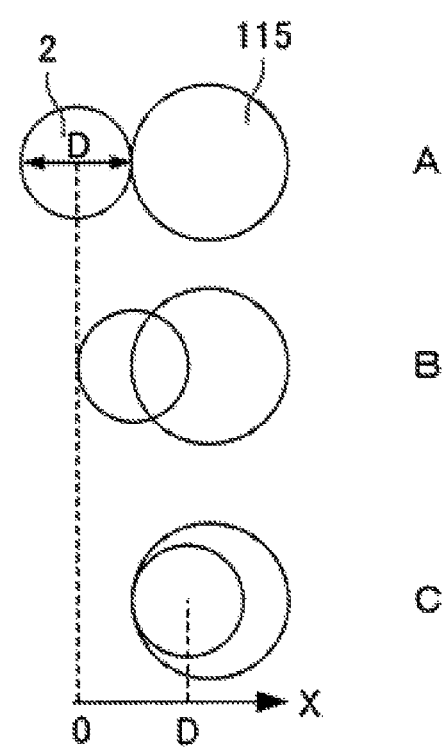
FIG. 4 is a diagram illustrating the relationship between the position of each diffraction disc in a detection surface and the number of electrons counted by a detector.
Figure 5:
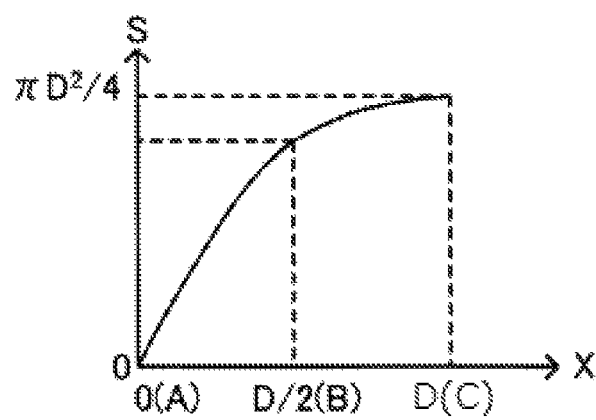
FIG. 5 is a graph showing the relationship between the position of each diffraction disc in the detection surface and the area occupied by each diffraction disc in the detection surface.

FIG. 4 illustrates the relationship between the position of each diffraction disc 2 in the detection surface 115 and the number of electrons counted by the detector 116. FIG. 5 is a graph showing the relationship between the position of each diffraction disc 2 in the detection surface 115 and the area S occupied by the diffraction disc 2 in the detection surface 115. In both FIGS. 4 and 5, the X-axis indicates the position of the diffraction disc 2. Under the condition A where the outer fringes of the diffraction disc 2 are in contact with the boundary (outer fringes) of the detection surface 115, it is assumed that X=0. Also, in FIG. 4, the diffraction disc 2 is adapted for transmitted waves, for example.

The number of electrons counted by the detector 116 is in proportion to the area S occupied by the diffraction disc 2 in the detection surface 115. Therefore, the position of the diffraction disc 2 in the detection surface 115 can be estimated from the number of the electrons counted by the detector 116, i.e., the intensity information output from the detector 116.

A mathematical function that interrelates the intensity corresponding to the number of counted electrons and the position of the diffraction disc 2 can be obtained, for example, by previously moving the diffraction disc 2 for a known distance using the imaging deflector system 112 and obtaining intensity information before and after the movement. Consequently, it is possible to estimate the position of the diffraction disc 2 in the detection surface 115 from the intensity information output from the detector 116. A specific example of this method is given below.

As shown in FIG. 4, the position of the disc 2 is so set using the imaging deflector system 112 that the state A (X=0)

is achieved. The intensity information output from the detector 116 is obtained. Then, the position of the diffraction disc 2 is varied to X=D/2 (state B) using the imaging deflector system 112, and the intensity information output from the detector 116 is acquired. Similarly, the position of the diffraction disc 2 is varied to X=D (state C) using the imaging deflector system 112, and the intensity information output from the detector 116 is obtained.

The relationship between the position X of the diffraction disc 2 in the detection surface 115 and the area S occupied by the diffraction disc 2 in the detection surface 115 is as shown in FIG. 5. The number of electrons counted by the detector 116 is in proportion to the area S occupied by the diffraction disc 2 in the detection surface 115. Therefore, the function that interrelates the intensity and the position of the diffraction disc 2 can be obtained from the measured intensity information in the states A, B, and C and from the graph of FIG. 5. This function makes it possible to estimate the position of the diffraction disc 2 in the detection surface 115 from the intensity information output from the detector 116.

The principle on which the deflection fields are measured in the charged particle system 100 is next described.

In the charged particle system 100, the electron probe is scanned over the sample by inputting the scan signal generated by the scan signal generator 118 into the illumination deflector system 106. At this time, the electrons transmitted through the sample are deflected by the deflection fields in the sample. As a result, the position of each diffraction disc 2 in the detection surface 115 is moved. Therefore, information about the strength and direction of each deflection field in the sample can be obtained by deriving information about the amount and direction of the movement of the diffraction disc 2.

In the charged particle system 100, the imaging deflector system 112 is controlled such that the electrons passing through one scan position on the sample are deflected under successively different deflection conditions. Thus, the diffraction disc 2 is focused onto successively different regions of the detection surface 115. The intensity information output from the detector 116 is stored in the frame memory 120 for each set of deflection conditions. Consequently, in the charged particle system 100, information about the amount and direction of movement of the diffraction disc 2 can be obtained. Also, information about the strengths of the deflection fields in the sample and about the direction of deflection can be obtained. The operation of the imaging deflector system 112 is described in detail below.

Figure 6:
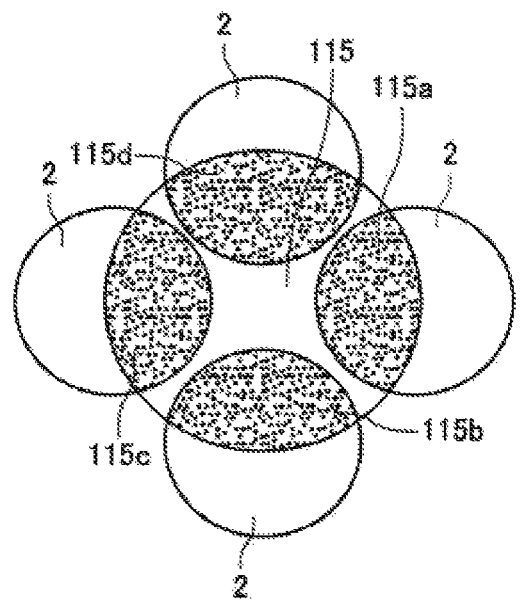
FIGS. 6 and 7 are diagrams illustrating the operation of an imaging deflector system included in the charged particle system of FIG. 1.

FIG. 6 illustrates the operation of the imaging deflector system 112. FIG. 6 shows a state in which electrons passing through a reference position of electron impingement on the sample at which no deflection field, for example, is produced are deflected by the imaging deflector system 112 and the diffraction discs 2 are brought to focus.

The imaging deflector system 112 operates such that diffraction discs 2 formed by the electrons passing through one scan position (one position of electron impingement) on the sample are successively focused onto different regions of the detection surface 115 as shown in FIG. 6.

In the charged particle system 100, plural sets of deflection conditions are set for the imaging deflector system 112. Each set of deflection conditions is composed of a deflection angle and a direction of deflection.

In the illustrated example, first through fourth sets of deflection conditions are set for the imaging deflector system 112. The imaging deflector system 112 focuses the successive diffraction discs 2 onto four regions 115a-115d, respectively, by deflecting the electrons at one scan position successively under the first through fourth sets of deflection conditions. When electrons hit the sample at one scan position, the imaging deflector system 112 deflects the electrons first under the first set of deflection conditions to focus one diffraction disc 2 onto the region 115a. Then, the imaging deflector system 112 deflects the electrons under the second set of deflection conditions and focuses another diffraction disc 2 onto the region 115b. Subsequently, the imaging deflector system 112 deflects the electrons under the third set of deflection conditions and focuses a further diffraction disc 2 onto the region 115c. Then, the imaging deflector system 112 deflects the electrons under the fourth set of deflection conditions and focuses a yet other diffraction disc 2 onto the region 115d.

The first through fourth sets of deflection conditions are so set that, when the imaging deflector system 112 deflects the electrons passing through the reference position of electron impingement on the sample, the diffraction discs 2 are focused across the boundary of the detection surface 115. This means that a part of each diffraction disc 2 is within the detection surface 115, while the rest lies outside the detection surface 115. For example, the first through fourth sets of deflection conditions are so set that the centers of the diffraction discs 2 lie on the boundary of the detection surface 115.

Furthermore, the first through fourth sets of deflection conditions are so set that, when the imaging deflector system 112 deflects the electrons passing through the reference position of electron impingement on the sample, the number of electrons counted by the detector 116 is equal for all of the regions 115a, 115b, 115c, and 115d. Under these deflection conditions, the regions 115a-115d are equal in area.

In addition, the first through fourth sets of deflection conditions are so set that, when the electrons passing through the reference position of electron impingement on the sample are deflected by the imaging deflector system 112, four diffraction discs 2 are focused at positions which are symmetrical with respect to the center of the detection surface 115. Under these deflection conditions, if the detection surface 115 is divided into four quadrants, the regions 115a-115d are located in the four quadrants, respectively.

Figure 7:
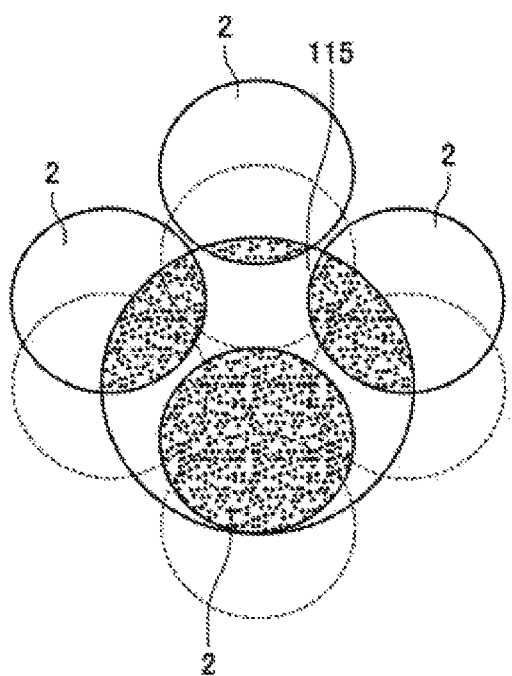

FIG. 7 illustrates the operation of the imaging deflector system 112, and shows a state in which deflection fields are produced in the sample at a scan position (position of electron impingement) on the sample.

In the charged particle system 100, as described previously, the imaging deflector system 112 deflects the electrons successively under the first through fourth sets of deflection conditions at each one scan position. Therefore, as shown in FIG. 7, when there are deflection fields in the sample, the four diffraction discs 2 move in the detection surface 115 according to their respective deflection fields in the sample.

In this way, in the charged particle system 100, the imaging deflector system 112 is controlled to deflect the electrons successively under the four sets of deflection conditions at each one scan position while scanning the electron probe by controlling the illumination deflector system 106. Intensity information and information about each scan position are stored in the frame memory 120 in an interrelated manner for each set of the deflection conditions.

The image generator 132 reads the intensity information and the information about the scan positions obtained for each set of the deflection conditions from the frame memory 120 and generates a scanned image for each set of the deflection conditions. Thus, a series of scanned images consisting of four scanned images is created. For instance, the image generator 132 creates a scanned image Ia in the first set of deflection conditions, a scanned image Ib in the second set of deflection conditions, a scanned image Ic in the third set of deflection conditions, and a scanned image Id in the fourth set of deflection conditions.

The image generator 132 generates an image Ia-Ic from the scanned images Ia and Ib and an image Ic-Id from the scanned images Ib and Id, for example. Consequently, the amount and direction of movement of each diffraction disc 2 can be computed. The deflection fields in the sample can be found from these pieces of information at each scan position of the probe. That is, information about a distribution of the deflection fields in the sample can be obtained.

The ranges where the deflection fields in the sample can be measured are from state A to state C shown in FIG. 4. Therefore, if the deflection fields in the sample are very large and the amount of movement of each diffraction disc 2 due to the deflection fields is greater than the diameter D of each diffraction disc 2, then the amount of movement of the disc 2 cannot be measured. In this case, the amount of movement of each diffraction disc 2 in the detection surface 115 may be brought to within a measurable range where the diffraction disc 2 stays within the detection surface 115 by adjusting the imaging optics 114.

Figure 8:
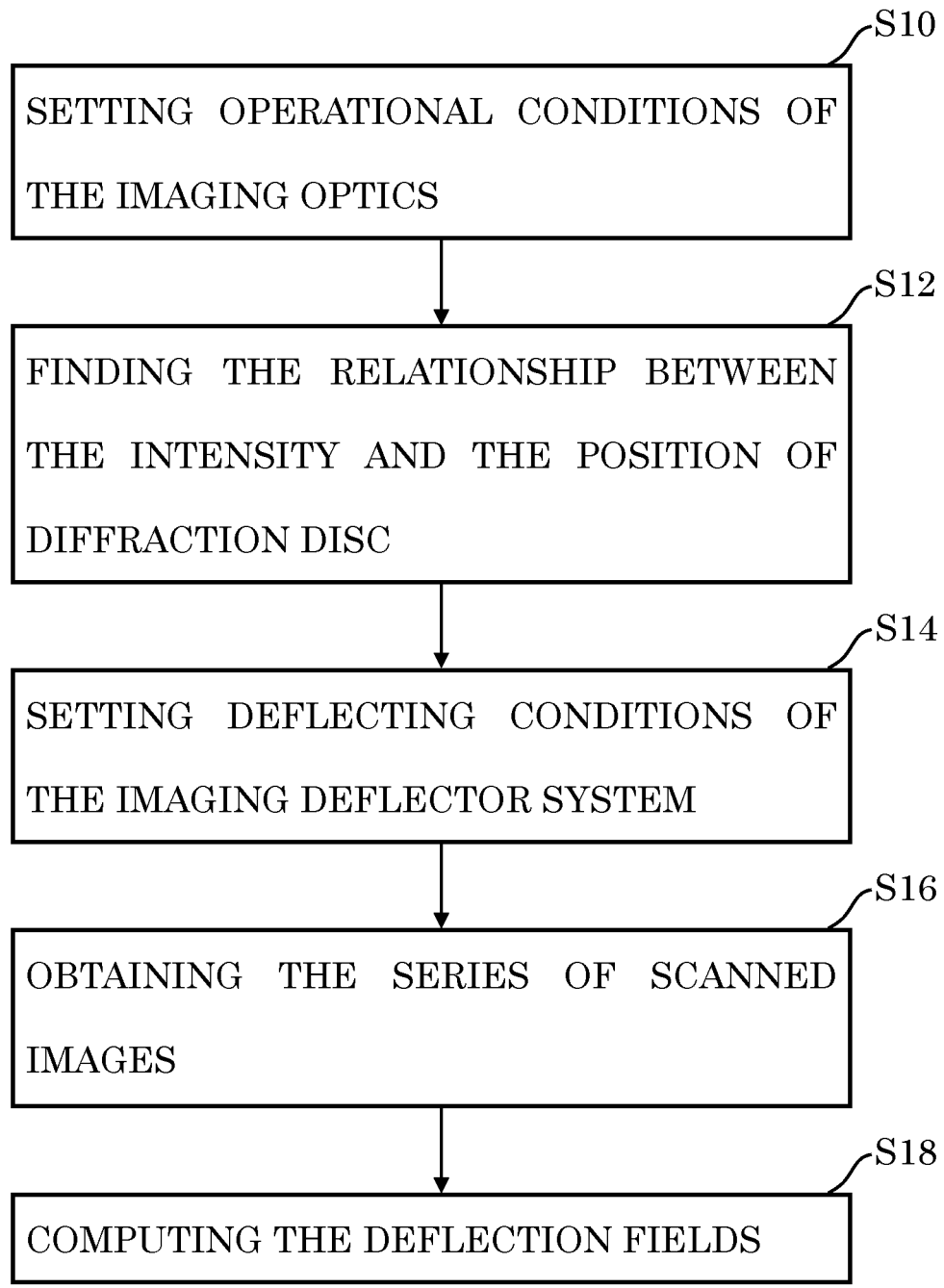
FIG. 8 is a flowchart illustrating one example of method of measuring the deflection fields by the use of the charged particle system of FIG. 1.

A process of measuring the deflection fields by the charged particle system 100 is next described. FIG. 8 is a flowchart illustrating one example of the method of measuring the deflection fields by the charged particle system 100.

First, operational conditions of the imaging optics 114 are set (step S10).

As an example, the imaging optics 114 are so set up that the diffraction discs 2 in the detection surface 115 do not move if the electron probe is scanned over the sample. Furthermore, the imaging optics 114 are so set up that the size of each diffraction disc 2 in the detection surface 115 is appropriate for measurement of the deflection fields in the sample.

Then, the relationship between the intensity corresponding to the number of electrons counted by the detector 116 and the position of each diffraction disc 2 in the detection surface 115 is found (step S12).

In particular, each diffraction disc 2 is first moved for a known distance using the imaging deflector system 112, and two sets of intensity information arising before and after, respectively, the movement of the diffraction disc 2 are obtained. The relationship between the intensity and the position of each diffraction disc 2 in the detection surface 115 is found from these two sets of intensity information.

Deflecting conditions of the imaging deflector system 112 are then set (step S14). In this example, the aforementioned first through fourth sets of deflection conditions are set and stored, for example, in the storage unit (not shown) of the charged particle system 100.

Then, the series of scanned images is obtained (step S16).

The operation of the charged particle system 100 performed when the series of scanned images is taken is now described. If a user makes a request for acquisition of the series of scanned images via the manual control unit (not shown) of the charged particle system 100, the controller 130 accepts the request and starts a processing subroutine for obtaining the series of scanned images.

First, the controller 130 controls the electron source 102, illumination optics 104, and illumination deflector system 106 to scan the electron probe over the sample. At this time, the controller 130 controls the imaging deflector system 112 in response to a scan signal and deflects the electrons successively under the first through fourth sets of deflection conditions at each scan position. Consequently, each diffraction disc 2 is brought to focus onto successively different regions of the detection surface 115. Intensity information output from the detector 116 and information about the scan positions are stored in the frame memory 120 in an interrelated manner for each set of the deflection conditions. The image generator 132 reads these sets of information from the frame memory 120 and generates the scanned images Ia, Ib, Ic, and Id for each set of the deflection conditions.

Because of the operations described so far, the series of scanned images can be obtained. Alternatively, in the charged particle system 100, the four scanned images Ia, Ib, Ic, and Id may be obtained by making one scan of a desired region of the sample. In this case, the imaging deflector system 112 deflects the electrons in the first through fourth sets of deflection conditions at one scan position to make four successive deflections. Then, the scan position is shifted to the next scan position, and the imaging deflector system 112 performs similar processing. The four scanned images Ia, Ib, Ic, and Id can be derived by repeating these operations.

In the charged particle system 100, the four scanned images Ia, Ib, Ic, and Id may be obtained by making four scans of a desired region of the sample according to the four sets of deflection conditions. In this case, the imaging deflector system 112 deflects the electrons under the first set of deflection conditions during the first scan. As a consequence, the scanned image Ia can be obtained. During the second scan, the imaging deflector system 112 deflects the electrons under the second set of deflection conditions. During the third scan, the imaging deflector system 112 deflects the electrons under the third set of deflection conditions. During the fourth scan, the imaging deflector system 112 deflects the electrons under the fourth set of deflection conditions. As a result, the scanned images Ib, Ic, and Id can be obtained.

The image generator 132 generates images Ia-Ic, Ib-Id, and so on for calculating the amount and direction of movement of each diffraction disc 2 from the obtained series of scanned images and computes a distribution of the deflection fields in the sample (step S18). Because of the processing steps described so far, the deflection fields in the sample can be measured.

The charged particle system 100 has the following features. In the charged particle system 100, the controller 130 controls the imaging deflector system 112 to deflect the electrons passing through a given position of electron impingement on the sample under successively different sets of deflection conditions and to focus the successive diffraction discs 2 into focus on their respective different regions of the detection surface 115. Intensity information is stored in the frame memory 120 for each set of the deflection conditions. As described previously, the strength and direction of each deflection field in the sample can be found from the intensity information about each set of deflection conditions. Hence, in the charged particle system 100, the deflection fields in the sample can be measured without the use of a segmented detector.

In the charged particle system 100, the controller 130 controls the imaging deflector system 112 to deflect the electrons under successively different sets of deflection conditions at each scan position and to focus the successive diffraction discs 2 onto their respective different regions of the detection surface 115. Intensity information and information about the scan positions are stored in the frame memory 120 in an interrelated manner for each set of the deflection conditions. Furthermore, in the charged particle system 100, the image generator 132 reads the intensity information and the information about the scan positions from the frame memory 120 for each set of the deflection conditions, and generates scanned images for each set of the deflection conditions. Consequently, the charged particle system 100 is capable of imaging the deflection fields in the sample.

In the measuring method associated with the present embodiment, the imaging deflector system 112 is controlled so that the electrons passing through a given position of electron impingement on the sample are deflected under successively different sets of deflection conditions and that the successive diffraction discs 2 are focused onto their respective different regions of the detection surface 115. Information about the electron intensity is obtained for each set of the deflection conditions. Therefore, in the measuring method associated with the present embodiment, as noted above, the deflection fields in the sample can be measured without using a segmented detector.

In the measuring method associated with the present embodiment, the deflection conditions are so set that, if electrons passing through a reference position of electron impingement on the sample are deflected by the imaging deflector system 112, each diffraction disc 2 is focused across the boundary of the detection surface 115. Consequently, the intensity information can be matched with the position of the diffraction disc 2. Since the positions of the diffraction discs 2 are affected by the deflection fields in the sample, in the measuring method associated with the present embodiment, the strength and direction of each deflection field in the sample can be found from the intensity information.

Furthermore, in the measuring method associated with the present embodiment, the deflection conditions are so set that, if electrons passing through a reference position of electron impingement on the sample are deflected by the imaging deflector system 112, the diffraction discs 2 are brought to focus at positions which are symmetrical with respect to the center of the detection surface 115. Therefore, in the measuring method associated with the present embodiment, the deflection fields in the sample can be computed with greater ease, for example, than where the diffraction discs 2 are not located symmetrically with respect to the center of the detection surface.

3. Modifications (1) First Modification

Figure 9:
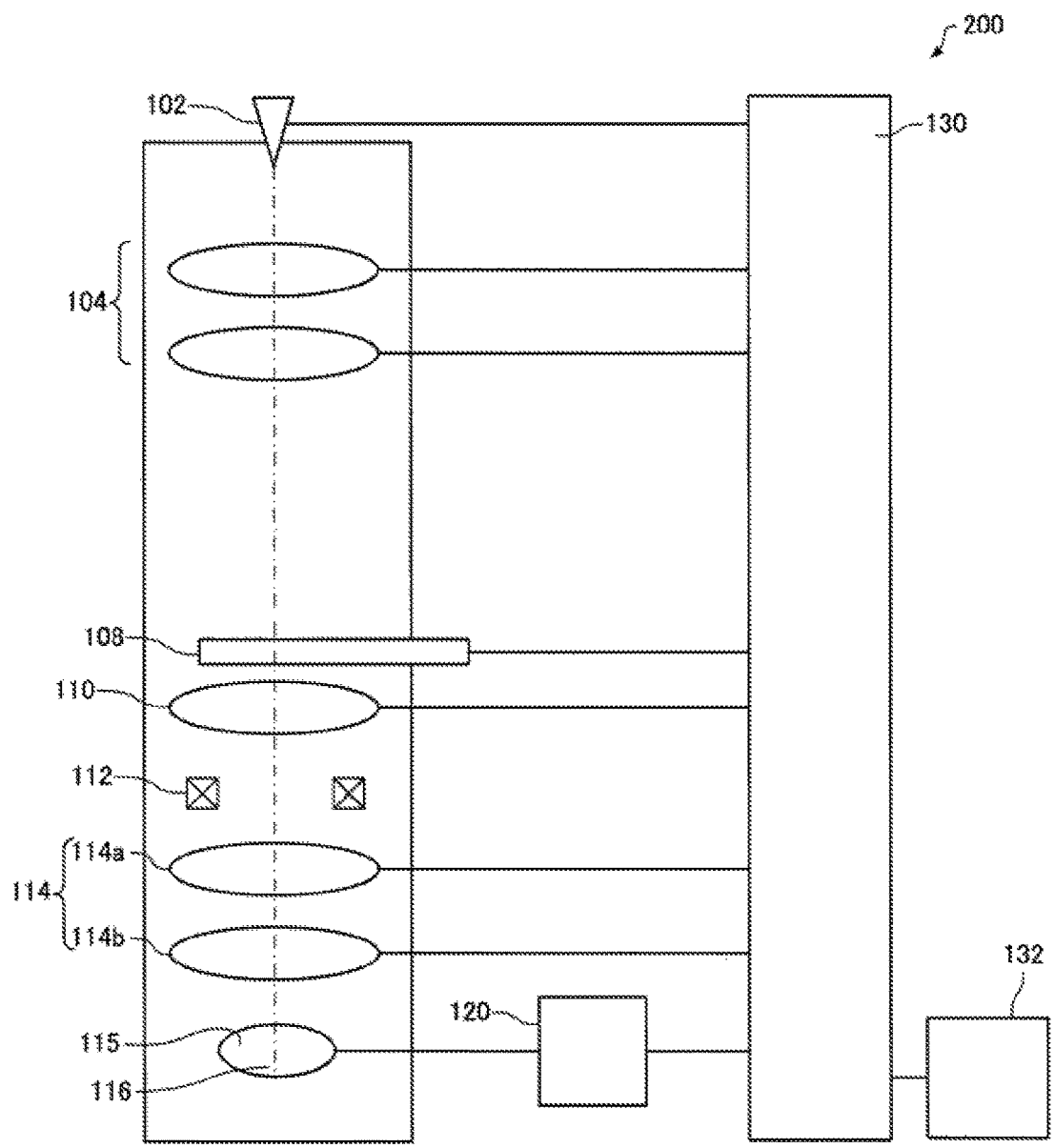
FIG. 9 is a schematic diagram similar to FIG. 1, but showing the configuration of a charged particle system associated with a first modification.

A charged particle system associated with a first modification of the present embodiment is next described by referring to FIGS. 9 and 6. FIG. 9 schematically shows the configuration of the charged particle system, 200, associated with the first modification. Those members of this charged particle system 200 which are similar in function to their respective counterparts of the above-described charged particle system 100 are indicated by the same reference numerals as in the above-referenced figures and a detailed description thereof is omitted.

The above-described charged particle system 100 is a scanning transmission electron microscope (STEM) having the illumination deflector system 106 and the scan signal generator 118 as shown in FIG. 1.

In contrast, the charged particle system 200 is a transmission electron microscope (TEM) that has neither the illumination deflector system 106 nor the scan signal generator 118 as shown in FIG. 9.

In the charged particle system 200, the controller 130 causes the electrons passing through a reference position of electron impingement on a sample to be deflected successively under first through fourth sets of deflection conditions, and intensity information is stored in the frame memory 120 for each set of the deflection conditions as shown in FIG. 6. Furthermore, the controller 130 causes the electrons passing through positions where deflection fields are produced in the sample to be deflected successively under the first through fourth sets of deflection conditions, and intensity information is stored in the frame memory 120 for each set of the deflection conditions as shown in FIG. 7. A deflection field in a desired position of the sample can be measured from the intensity information obtained from the sets of deflection conditions at two positions.

The operation of the charged particle system 200 is similar to the operation of the above-described charged particle system 100 except that the electron probe is made to impinge at a reference position of electron impingement on the sample and also at a desired position on the sample without scanning the electron probe and thus a description thereof is omitted.

In the charged particle system 200, the deflection fields in the sample can be measured without using a segmented detector, in the same way as the above-described charged particle system 100.

(2) Second Modification

Figure 10:
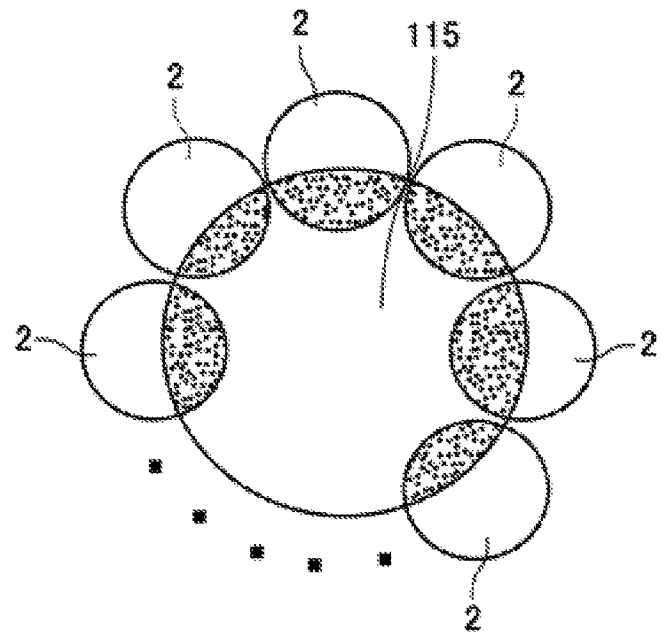
FIGS. 10 and 11 are diagrams illustrating the operation of an image deflector system included in a charged particle system associated with a second modification.
Figure 11:
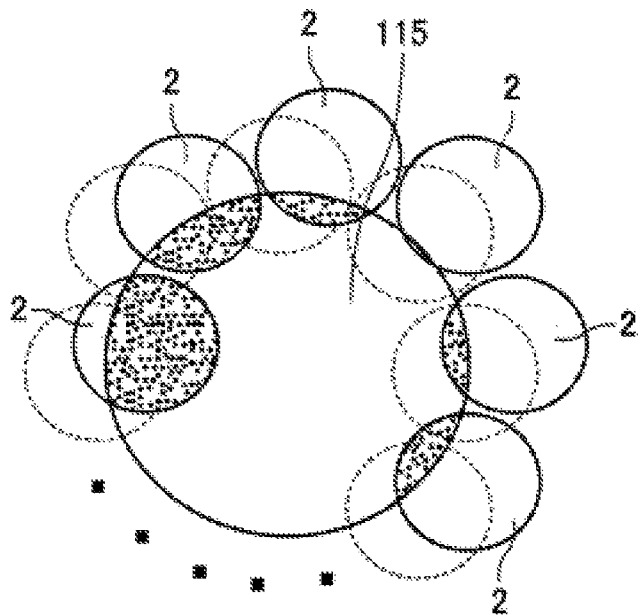

A charged particle system associated with a second modification of the present embodiment is next described by referring to FIGS. 10 and 11, which illustrate the operation of the imaging deflector system 112 of the charged particle system associated with the second modification. FIG. 10 illustrates a state in which electrons passing through the reference position of electron impingement on the sample are deflected by the imaging deflector system 112 and the diffraction discs 2 are brought to focus. FIG. 10 corresponds to FIG. 6. FIG. 11 illustrates a state in which deflection fields are produced in the sample at a scan position (position of electron impingement) on the sample, and corresponds to FIG. 7.

The charged particle system associated with the second modification is identical in configuration with the charged particle system 100 of FIG. 1 and thus is omitted from being shown.

In the above-described charged particle system 100, as shown in FIGS. 6 and 7, the controller 130 controls the imaging deflector system 112 to cause the electrons passing through a given position of electron impingement on the sample to be deflected successively under the first through fourth sets of deflection conditions and to bring the diffraction discs 2 into focus onto successively different four regions of the detection surface 115, whereby the deflection fields in the sample are measured.

On the other hand, in the present modification, as shown in FIGS. 10 and 11, the controller 130 controls the imaging deflector system 112 to cause the electrons passing through a given position of electron impingement on the sample to be deflected under successively different, first to Nth (where N is an integer equal to or greater than 5) sets of deflection conditions and to bring the diffraction discs 2 into focus onto successively different N regions of the detection surface 115, whereby the deflection fields in the sample are measured.

As shown in FIG. 10, the first through Nth sets of deflection conditions are so set that, if the imaging deflector system 112 deflects electrons passing through a reference position of electron impingement on the sample, N diffraction discs 2 are brought to focus at positions which are symmetrical with respect to the center of the detection surface 115.

A method of measuring deflection fields using the charged particle system associated with the present modification is next described. This method is similar to the method of measuring deflection fields using the charged particle system 100 as illustrated in FIG. 8 except for step S16 of obtaining a series of scanned images and step S18 of calculating the deflection fields. Only these differences of the measuring method associated with the present modification with the measuring method using the above-described charged particle system 100 as illustrated in FIG. 8 are described below.

Specifically, in the present modification, if a user makes a request for acquisition of a series of scanned images via the manual control unit (not shown) of the charged particle system 100, the controller 130 responds to the request and starts a processing subroutine for obtaining the series of scanned images.

First, the controller 130 controls the electron source 102, illumination optics 104, and illumination deflector system 106 to scan the electron probe over the sample. The controller 130 controls the imaging deflector system 112 in response to a scan signal to deflect electrons successively under the first through Nth sets of deflection conditions at each scan position. Consequently, the diffraction discs 2 are brought to focus onto successively different regions of the deflection surface 115. Intensity information output from the detector 116 and information about the scan positions are stored in an interrelated manner in the frame memory 120 for each set of the deflection conditions. The image generator 132 reads these sets of information from the frame memory 120 and generates scanned images $I_1, I_2, I_3, \ldots, I_{N-1}$, and $I_N$ for each set of the deflection conditions. Because of the operations described so far, the series of scanned images can be obtained.

The image generator 132 generates images, which are used to compute the amount and direction of movement of each diffraction disc 2, from the obtained series of scanned images and computes a distribution of the deflection fields in the sample (step S18).

According to the present modification, in the imaging deflector system 112, electrons passing through one scan position are deflected under more sets of deflection conditions than in the above-described charged particle system 100 and, therefore, the resolution in the directions of the deflection fields in the sample can be improved.

The present invention embraces configurations substantially identical (e.g., in function, method, and results or in purpose and advantageous effects) with the configurations described in the embodiment of the invention. Furthermore, the invention embraces configurations described in the embodiment and including portions which have non-essential portions replaced. In addition, the invention embraces configurations which produce the same advantageous effects as those produced by the configurations described in the embodiment or which can achieve the same objects as the configurations described in the embodiment. Further, the invention embraces configurations which are similar to the configurations described in the embodiment except that well-known techniques have been added.

Having thus described my invention with the detail and particularity required by the Patent Laws, what is desired protected by Letters Patent is set forth in the following claims.

The invention claimed is:

1. A charged particle system comprising:
   a charged particle source for producing a charged particle beam;
   illumination optics for focusing the charged particle beam produced by the charged particle source onto a sample;
   an illumination deflector system that deflects the charged particle beam produced by the charged particle source and focused by the illumination optics to scan said charged particle beam over said sample;
   an objective lens for focusing charged particles transmitted through the sample at each scan position of the charged particle beam impingement on the sample;
   an imaging deflector system disposed behind the objective lens and operative to deflect the charged particles transmitted through the sample and focused by the objective lens;
   a detector having a detection surface and operative to detect the charged particles transmitted through the sample that are incident thereon and to output intensity information corresponding to a number of the detected charged particles, wherein the detection surface of the detector is not segmented;
   imaging optics disposed behind the imaging deflector system and operative to focus the charged particles transmitted through the sample and deflected by the imaging deflector system as one diffraction disc onto the detection surface;
   a storage unit for storing the intensity information output from the detector; and
   a controller for controlling the illumination deflector system and the imaging deflector system;
   wherein said controller controls the illumination deflector system to cause the focused charged particle beam to scan over the sample;
   wherein said controller controls said imaging deflector system, at each scan position of the charged particle beam impingement on the sample, to cause the charged particles transmitted through the scan position to be deflected under at least four different sets of deflection conditions for deflecting said one diffraction disc in at least four different directions and to bring said one diffraction disc into focus onto at least four different positions of said detection surface, at each position, a part of the one diffraction disc located outside of said detection surface;
   wherein said storage unit, at each scan position of the charged particle beam impingement on the sample, stores the intensity information and information about the at least four different positions in an interrelated manner for each set of the at least four different sets of deflection conditions; and
   wherein an image generator reads the intensity information and information about the at least four different positions to generate scanning images for each of the at least four different sets of deflection conditions, and computes an amount and direction of movement of the one diffraction disc at the at least four different positions and computes a distribution of deflection fields in the sample.

2. A method of measuring deflection fields in a sample within a charged particle system which has a charged particle source for producing a charged particle beam, illumination optics for focusing the charged particle beam produced by the charged particle source onto the sample, an illumination deflector system that deflects the charged particle beam produced by the charged particle source and focused by the illumination optics to scan said charged particle beam over said sample, an objective lens for focusing charged particles transmitted through the sample at each scan positions of the particle beam impingement on the sample, an imaging deflector system disposed behind the objective lens and operative to deflect the charged particles transmitted through the sample, a detector having a detection surface, wherein the detection surface of the detector is not segmented, and operative to detect the charged particles transmitted through the sample that are incident thereon and to output intensity information corresponding to a number of the detected charged particles, and imaging optics disposed behind the imaging deflector system and operative to focus the charged particles transmitted through the sample and deflected by the imaging deflector system as one diffraction disc onto the detection surface, said method comprising the steps of:

controlling the illumination deflector system to cause the focused charged particle beam to scan over the sample;

controlling said imaging deflector system, at each scan position of the charged particle beam impingement on the sample, to cause the charged particles transmitted through the scan position to be deflected under at least four different sets of deflection conditions for deflecting said one diffraction disc in at least four different directions and to bring said one diffraction disc into focus onto at least four different positions of said detection surface, at each position, a part of the one diffraction disc located outside of said detection surface;

obtaining, at each scan position of the charged particle beam impingement on the sample, said intensity information for each set of the at least four different sets of deflection conditions;

storing the obtained intensity information and information about the at least four different positions in an interrelated manner for each set of the at least four different sets of deflection conditions;

reading the intensity information and information about the at least four different positions to generate scanning images for each of the at least four different sets of deflection conditions;

computing an amount and direction of movement of the one diffraction disc at the at least four different positions; and computing a distribution of the deflection fields in the sample.

3. The method of claim 2, wherein said at least four different sets of deflection conditions are so set that, when the charged particles passing through a reference position of particle impingement on said sample are deflected by said imaging deflector system, said one diffraction disc is focused across a boundary of said detection surface.

4. The method of claim 2, wherein said at least four different sets of deflection conditions are so set that, when the charged particles passing through a reference position of particle impingement on said sample are deflected by said imaging deflector system, said one diffraction disc is focused at positions which are symmetrical with respect to a center of said detection surface.

5. The method as set forth in claim 2, further comprising:

determining a measurement of strength and a measurement of direction for one or more deflection fields in the sample based on the intensity information for each set of the deflection conditions.

6. A system comprising:

a charged particle source for producing a charged particle beam;

illumination optics for focusing the charged particle beam produced by the charged particle source onto a sample;

an illumination deflector system that deflects the charged particle beam produced by the charged particle source and focused by the illumination optics to scan said charged particle beam over said sample;

an objective lens for focusing charged particles transmitted through the sample at each scan position of the charged particle beam impingement on the sample;

an imaging deflector system disposed behind the objective lens and operative to deflect the charged particles transmitted through the sample and transmitted through the objective lens;

imaging optics disposed behind the imaging deflector system;

a detector having a circular detection surface that is centered at an optical axis of the objective lens, wherein the detector is operative to detect the charged particles transmitted through the sample that are incident on the detector and to output intensity information corresponding to the charged particles incident on the detector, wherein the detection surface of the detector is not segmented;

a storage unit for storing the intensity information output from the detector; and a controller for controlling the imaging deflector system;

wherein the imaging optics are operative to focus the charged particles transmitted through the sample and deflected by the imaging deflector system as one or more diffraction discs onto the circular detection surface;

wherein the controller controls the imaging deflector system, at each scan position of the charged particle beam impingement on the sample, to cause the charged particles passing through the scan position to be deflected under at least four deflection conditions for deflecting said one or more diffraction discs in at least four different directions and to bring said one or more diffraction discs into focus onto at least four different positions of said detection surface, wherein, at each position, a part of the one diffraction disc is located outside of said detection surface;

wherein the storage unit, at each scan position of the charged particle beam impingement on the sample, stores the intensity information and information about the at least four different positions in an interrelated manner for each of the at least four deflection conditions; and wherein an image generator reads the intensity information and information about the at least four different positions to generate scanning images for each of the at least four different sets of deflection conditions, and computes an amount and direction of movement of the one diffraction disc at the at least four different positions and computes a distribution of deflection fields in the sample.

7. The charged particle system as set forth in claim 6, wherein each set of deflection conditions of the at least four different sets of deflection conditions for deflecting said one diffraction disc in at least four different directions comprise a deflection angle of the charged particles and a direction of deflection of the charged particles.

8. The charged particle system as set forth in claim 1, further comprising a scan signal generator, wherein the illumination deflector system receives a scan signal generated by the scan signal generator and the illumination deflector system deflects the charged particles produced by the charged particle source and focused by the illumination optics to scan said charged particles over said sample based on the scan signal generated by the scan signal generator.

9. The charged particle system as set forth in claim 1, wherein the controller controls the imaging deflector system to cause the charged particles transmitted through the sample and passing through the given position of particle impingement on the sample to be deflected:
  under a first set of deflection conditions of the at least four different sets of deflection conditions to focus the charged particles transmitted through the sample and focused by the objective lens as the one diffraction disc onto a first position of the at least four different positions of the detection surface;
  under a second set of deflection conditions of the at least four different sets of deflection conditions to focus the charged particles transmitted through the sample and focused by the objective lens as the one diffraction disc onto a second position of the at least four different positions of the detection surface after focusing the charged particles onto the first position of the detection surface;
  under a third set of deflection conditions of the at least four different sets of deflection conditions to focus the charged particles transmitted through the sample and focused by the objective lens as the one diffraction disc onto a third position of the at least four different positions of the detection surface after focusing the charged particles onto the second position of the detection surface; and
  under a fourth set of deflection conditions of the at least four different sets of deflection conditions to focus the charged particles transmitted through the sample and focused by the objective lens as the one diffraction disc onto a fourth position of the at least four different positions of the detection surface after focusing the charged particles onto the third position of the detection surface.

* * * * *